United States Patent
Nishimura

(10) Patent No.: US 6,847,545 B2
(45) Date of Patent: Jan. 25, 2005

(54) MAGNETIC THIN FILM ELEMENT, MEMORY ELEMENT USING THE SAME, AND METHOD FOR RECORDING AND REPRODUCING USING THE MEMORY ELEMENT

(75) Inventor: Naoki Nishimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 10/689,717

(22) Filed: Oct. 22, 2003

(65) Prior Publication Data

US 2004/0085803 A1 May 6, 2004

Related U.S. Application Data

(62) Division of application No. 09/794,499, filed on Feb. 28, 2001, now Pat. No. 6,654,279, which is a division of application No. 09/236,356, filed on Jan. 25, 1999, now Pat. No. 6,219,275.

(30) Foreign Application Priority Data

Jan. 28, 1998 (JP) .............................................. 10/15633

(51) Int. Cl.⁷ .............................................. G11C 11/16
(52) U.S. Cl. ........................ 365/158; 365/171; 365/173
(58) Field of Search ................................ 365/158, 171, 365/173

(56) References Cited

U.S. PATENT DOCUMENTS

| 5,173,873 | A   | 12/1992 | Wu et al. .................... 365/173 |
| 5,343,422 | A   | 8/1994  | Kung et al. .................. 365/173 |
| 5,347,485 | A   | 9/1994  | Taguchi et al. ............. 265/173 |
| 5,361,226 | A   | 11/1994 | Taguchi et al. ............. 365/171 |
| 5,715,121 | A   | 2/1998  | Sakakima et al. .......... 365/158 |
| 5,768,183 | A   | 6/1998  | Zhu et al. .................... 365/173 |
| 5,774,394 | A   | 6/1998  | Chen et al. ................. 365/173 |
| 5,841,611 | A   | 11/1998 | Sakakima et al. .......... 365/113 |
| 6,104,632 | A   | 8/2000  | Nishimura ................... 365/158 |
| 6,219,275 | B1  | 4/2001  | Nishimura ................... 365/173 |
| 6,613,678 | B1  | 9/2003  | Sakaguchi et al. .......... 438/695 |
| 6,628,542 | B2* | 9/2003  | Hayashi et al. ............. 365/158 |

FOREIGN PATENT DOCUMENTS

JP          4-023293        1/1992

OTHER PUBLICATIONS

Sakakima et al., "Solidstate Memory Using GMR Films", Journal of the Japan Society of Applied Magnetics, vol. 20, No. 1 (1996).
Patent Abstracts of Japan, vol. 1997, No. 04, Apr. 30, 1997 & JP 08 321016 A (Sanyo Electric Co Ltd), Dec. 3, 1996.
Patent Abstracts of Japan, Vo. 1998, No. 10, Aug. 31, 1998 & JP 10 134560 A (Victor Co. of Japan Ltd), May 22, 1998.
Patent Abstracts of Japan, Vo. 016, No 341, Jul. 23, 1992 & 04 103014 A (Hitachi Ltd), Apr. 6, 1992.

* cited by examiner

Primary Examiner—Tan T. Nguyen
(74) Attorney, Agent, or Firm—Fitzpatrick, Cella, Harper & Scinto

(57) ABSTRACT

A magnetic thin film element is provided with a magnetoresistive film including a first magnetic layer composed of a perpendicular magnetization film, a second magnetic layer composed of a perpendicular magnetization film having a higher coercive force than that of the first magnetic layer, and a nonmagenetic layer interposed between the first magnetic layer and the second magnetic layer. The resistance of the magnetoresistive film varies depending on whether or not the magnetic spins of the first magnetic layer and the second magnetic layer are in the same direction.

1 Claim, 8 Drawing Sheets

MAGNETIC THIN FILM ELEMENT, MEMORY ELEMENT USING THE SAME, AND METHOD FOR RECORDING AND REPRODUCING USING THE MEMORY ELEMENT

CROSS-REFERENCE TO RELATED APPLICATION

This application is a divisional of application Ser. No. 09/794,499, filed Feb. 28, 2001, now U.S. Pat. No. 6,654,279 which is a divisional of application Ser. No. 09/236,356, filed Jan. 25, 1999, now U.S. Pat. No. 6,219,275.

BACKGROUND OF THE INVENTION

1. Field of the Invention

The present invention relates to a magnetic thin film element making use of a giant magnetoresistive (GMR) effect, a memory element using the magnetic thin film element, and a method for recording and reproducing using the memory element.

2. Description of the Related Art

Although a magnetic thin film memory is a solid-state memory with no active part as is the case of a semiconductor memory, in the magnetic thin film memory, information is not lost even if a power supply is cut off, writing is enabled repeatedly up to an unlimited number of times, and there is no danger that the memory content may vanish with exposure to radiation, which are advantages in comparison with the semiconductor memory. In particular, recently, a thin film magnetic memory using the giant magnetoresistive (GMR) effect is receiving attention because of a larger output in comparison with a conventional thin film magnetic memory using an anisotropic magnetoresistive effect.

For example, in the Journal of the Japan Society of Applied Magnetics (Vol. 20, P.22, 1996), a solid-state memory is disclosed, in which a memory element is fabricated by depositing a plurality of times a structure including a hard magnetic layer (HM), a nonmagnetic layer (NM), a soft magnetic layer (SM), and a nonmagnetic layer (NM).

FIG. 1 is a schematic sectional view showing a structure of such a solid-state memory. In the drawing, numeral 1 represents a hard magnetic layer, numeral 2 represents a nonmagnetic layer, and numeral 3 represents a soft magnetic layer. In this solid-state memory, a sense line 4 is provided on both sides the magnetic film, and a word line 5 is provided, and is isolated from the sense line 4 by an insulating layer 6. An electric current is applied to the word lines 5 and the sense line 4, and information is written means of the magnetic field generated as a result.

Specifically, as shown in FIGS. 2A through 2D, by applying an electric current to the word line 5, a magnetic field is generated in a different direction in response to the direction of electric current represented by numeral 7. The magnetization of the hard magnetic layer 1 is reversed by the magnetic field to record a memory in a state of "0" or "1". In FIGS. 2A and 2C, the horizontal axis represents time T and the vertical axis represents electric current I. In FIGS. 2B and 2D, the same members as those in FIG. 1 are represented by the same numeral as in FIG. 1, and detailed descriptions will be omitted.

For example, by applying a positive current, as shown in FIG. 2A, to produce a rightward magnetic field, a memory state of "1" is recorded as shown in FIB. 2B. Also, by applying a negative current, as shown in FIG. 2C, to produce a leftward magnetic field, a memory state of "0" is recorded as shown in FIG. 2D.

In order to read information, as shown in FIGS. 3A through 3E, an electric current 7 that is smaller than the recording current is applied to the word line 5 to reverse the magnetization of the soft magnetic layer 3 only, and a resulting change in resistance is detected.

In FIG. 3A, the horizontal axis represents time T and the vertical axis represents electric current I. Also, in FIGS. 3B through 3E, the same members as those in FIG. 1 are represented by the same numeral as in FIG. 1, and detailed descriptions will be omitted.

When the giant magnetoresistive effect is used, resistance varies depending on whether the magnetizations of the soft magnetic layer SM and the hard magnetic layer HM are parallel or antiparallel. Thus, a memory in a state of "1" can be discriminated from a memory in a state of "0" in response to the change in resistance. For example, as shown in FIG. 3A, when a current is applied as a positive pulse and then a negative pulse, the magnetization of the soft magnetic layer 3 changes from rightward to leftward, and with respect to the memory in a state of "1", a small resistance as shown in FIG. 3B is replaced by a large resistance as shown in FIG. 3C. On the other hand, with respect to the memory in a state of "0", a large resistance as shown in FIG. 3D is replaced by a small resistance as shown in FIG. 3E. By detecting the change in resistance as described above, information recorded in the hard magnetic layer HM can be read regardless of the magnetization condition of the soft magnetic layer SM after recording.

In the conventional magnetic thin-film memory having the structure described above, however, as the area of the memory cell decreases, a demagnetizing field (self-demagnetizing field) generated in the magnetic layer increases so as to not be negligible, and the magnetization direction of the magnetic layer that stores records is no longer fixed in one direction, resulting in instability. Therefore, in the conventional magnetic thin-film memory, the refinement (reduction in size) of a on-bit cell and the stable storage of information are incompatible, and high integration is impossible.

SUMMARY OF THE INVENTION

It is an object of the present invention to solve the problems in the conventional art described above and to provide a magnetic thin film element in which instability of the magnetization can be prevented even if the element is finely structured (very small).

It is another object of the present invention to provide a memory element which stores information with high stability and can be highly integrated.

In order to achieve the first object of the present invention, in one aspect, a magnetic thin film element is provided with a magnetoresistive film which includes a first magnetic layer composed of a perpendicular magnetization film, a second magnetic layer composed of a perpendicular magnetization film having a higher coercive force than that of the first magnetic layer, and a nonmagnetic layer interposed between the first magnetic layer and the second magnetic layer. The resistance of the magnetoresistive film varies depending on whether or not the magnetic spins of the first magnetic layer and the second magnetic layer are in the same direction.

In the magnetic thin film element, the nonmagnetic layer may be composed of a good conductor or an insulator.

In order to achieve the second object of the present invention, in another aspect, a memory element includes the magnetic thin film element described above and at least one write line composed of a good conductor provided in the vicinity of the magnetoresistive film of the magnetic thin film element with an insulator therebetween.

In the memory element described above, a plurality of write lines may be provided on the sides of the magnetoresistive film. In the memory element, information may be retained in response to the direction of the magnetic spin of the first magnetic layer, and the direction of the magnetic spin of the second magnetic layer may always be maintained in the same direction. Alternatively, information may be retained in response to the direction of the magnetic spin of the second magnetic layer.

In still another aspect, a magnetic thin film memory, in accordance with the present invention, includes a plurality of memory elements described above arrayed in a matrix on a substrate, and a magnetoresistive film of each memory element is electrically connected to a semiconductor device composed of a field effect transistor or a diode.

In a further aspect, a method for recording using the memory element, in accordance with the present invention, includes applying an electric current to the write line, fixing a direction of the magnetic spin of the first magnetic layer by means of a magnetic field generated by the electric current, and changing the direction of the electric current to be applied to the write line to record a memory state of "0" or "1".

In a still further aspect, a method for reproducing using the memory element, in accordance with the present invention, includes detecting resistance of the magnetoresistive film to reproduce information recorded as the direction of the magnetic spin in the first magnetic layer.

In a yet further aspect, a method for recording using the memory element, in accordance with the present invention, includes applying an electric current to the write line, fixing a direction of the magnetic spin of the second magnetic layer by means of a magnetic field generated by the electric current, and changing the direction of the electric current to be applied to the write line to record a memory state of "0" or "1".

In a yet further aspect, a method for reproducing using the memory element, in accordance with the present invention, includes applying an electric current to the write line, and using a change in resistance resulting from the reversal of the magnetic spin of the first magnetic layer caused by a magnetic field generated by the electric current to reproduce information recorded in the second magnetic layer.

Further objects, features and advantages of the present invention will become apparent from the following description of the preferred embodiments with reference to the attached drawings.

DESCRIPTION OF THE PREFERRED EMBODIMENTS

The present invention will be described in detail with reference to the drawings.

Embodiment 1

Figure 1:
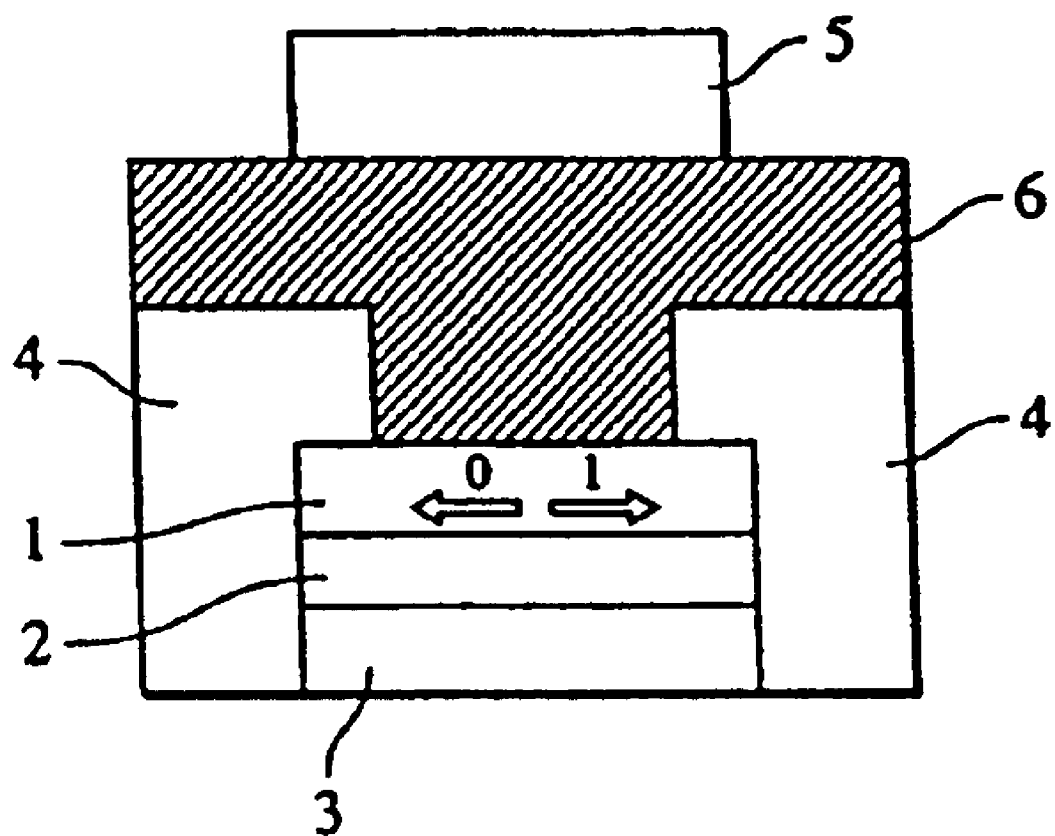
FIG. 1 is a schematic sectional view showing a structure of a conventional magnetic thin film memory element.
Figure 2A:
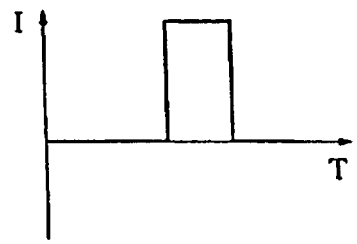
FIGS. 2A through 2D are diagrams which illustrate the recording of information in a conventional magnetic thin film memory element.
Figure 2B:
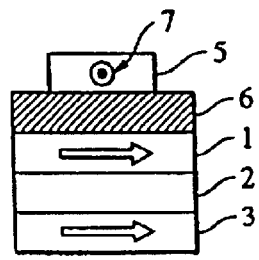
Figure 2C:
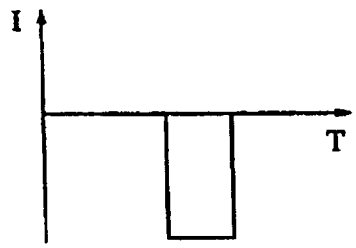
Figure 2D:
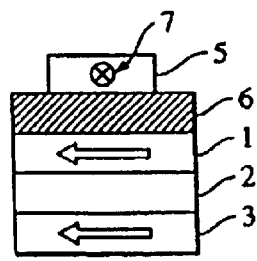
Figure 3A:
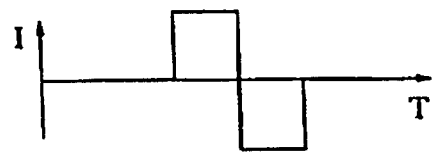
FIGS. 3A through 3E are diagrams which illustrate the reproducing of information in a conventional magnetic thin film memory element.
Figure 3B:
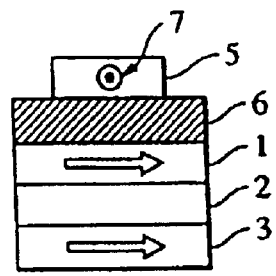
Figure 3C:
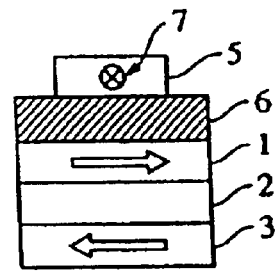
Figure 3D:
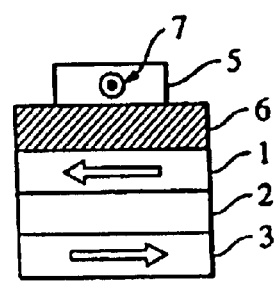
Figure 3E:
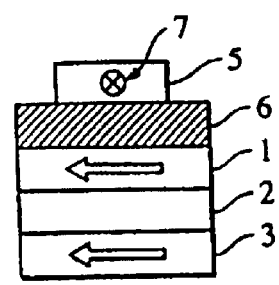
Figure 4A:
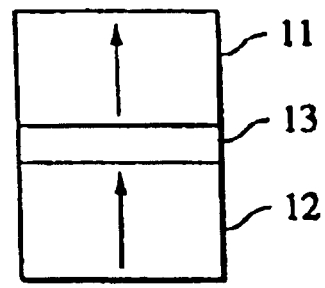
FIGS. 4A and 4B are schematic sectional views showing a structure of a magnetic thin film element in accordance with the present invention.
Figure 4B:
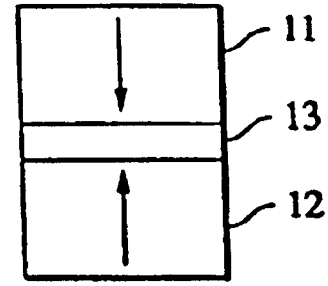

FIGS. 4A and 4B are schematic sectional views showing a structure of a magnetic thin film element in accordance with the present invention. Numeral 11 represents a first magnetic layer composed of a perpendicular magnetization film, numeral 12 represents a second magnetic layer composed of a perpendicular magnetization film having a higher coercive force at room temperature in comparison with the first magnetic layer 11, and numeral 13 represents a nonmagnetic layer. The first magnetic layer 11 is deposited on the second magnetic layer 12 with the nonmagnetic layer 13 therebetween. The arrows represent magnetization direction, in particular, a direction of the spin constituting the magnetization. In FIG. 4A, the magnetic spin directions of the first magnetic layer 11 and the second magnetic layer 12 are parallel, and in FIG. 4B, they are antiparallel.

Materials for the first magnetic layer 11 and the second magnetic layer 12 include magnetic materials exhibiting perpendicular magnetization such as a ferrimagnetic film that is an alloy of a rare earth element and a transition element of the iron group (RE/TM), a garnet film that is an oxide magnetic film, an artificial lattice film of a rare earth element and a transition metal of the iron group (RE/TM), PtCo, and PdCo.

As a RE-TM material, GdFe, GdFeCo, TbFe, TbFeCo, DyFe, DyFeCo, or the like is preferably used because of an easy exhibition of perpendicular magnetization. Among the magnetic films mentioned above, GdFe or GdFeCo is more preferable as a material for the first magnetic layer 11 because its coercive force can be decreased. Although, as a material for the second magnetic layer 12, TbFe, TbFeCo, DyFe, DyFeCo, or the like is preferably used because its coercive force can be increased, when the reversal of coercive force can be increased, when the reversal of magnetization is caused by a magnetic field generated by an electric current, the required electric current value may be excessively large because of the excessively high coercive force in those materials, and thus, by using GdFe, GdFeCo, or the like, the composition is adjusted so that the second magnetic layer 12 has a larger coercive force than that of the first magnetic layer 11.

In the magnetic thin film element of the present invention, resistance varies depending on whether the spin directions of the first magnetic layer 11 and the second magnetic layer 12 are parallel or antiparallel. For example, as shown in FIG. 4A, when the directions of the spins of the first magnetic layer i1 and the second magnetic layer. 12 are parallel, resistance is low, and as shown in FIG. 4B, when the spin directions of the first magnetic layer 11 and the second magnetic layer 12 are antiparallel, resistance is high.

Figure 5A:
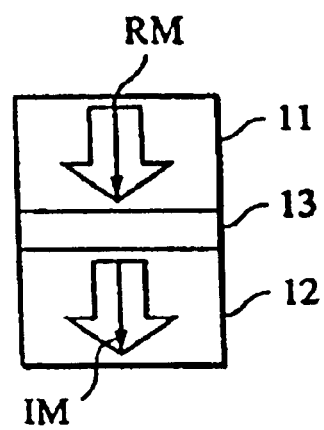
FIGS. 5A and 5B are diagrams which illustrate the magnetization of a magnetic thin film element in accordance with the present invention.
Figure 5B:
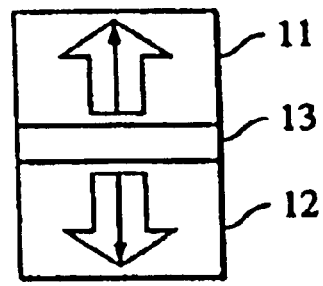

Further description will be made with reference to FIGS. 5A and 5B, using a RE-TM material. In FIGS. 5A and 5B, the same members as those in FIGS. 4A and 4B are represented by the same numerals as in FIGS. 4A and 4B, and detailed n descriptions will be omitted.

In FIGS. 5A and 5B the outlined arrows represent a net magnetization direction RM, which corresponds to a difference in magnetization between a rare earth element and an element of the iron group, and the black arrows represent a magnetization direction IM of a transition element of the iron group. When the magnetic film is a ferrimagnetic film composed of a rare earth element and a transition element of the iron group, the sub-lattice magnetizations of the individual elements are antiparallel. The magnetization of the rare earth element is caused by 4f electrons. However, since the 4f electrons are deep within an inner shell, they do not greatly contribute to electric conductivity. On the other hand, some of the 3d electrons which contribute to the magnetization of the transition element of the iron group are conduction electrons because they are near an outer shell. Therefore, magneto-resistance depending on a difference in spin direction is more easily influenced by the spin of the transition element of the iron group. Accordingly, the spin direction caused by magneto-resistance depends on the spin direction of the element of the iron group. For example, as shown in FIG. 5A, when the magnetic moment of the element of the iron group of the first magnetic layer 11 is parallel to that of the second magnetic layer 12, resistance is small, and as shown in FIG. 5B, when antiparallel, resistance is large.

Although, in FIGS. 5A and 5B, the transition element of the iron-group-rich (TM-rich) structure is used, in which the net magnetizations of the individual magnetic layers and the magnetization of the element of the iron group are in the same direction, other structures may be used, for example, a structure in which the first magnetic layer 11 is rare-earth-element-rich (RE-rich) and the second magnetic n layer 12 is TM rich, or vice versa.

Since the magnetic thin film element in the present invention is composed of a perpendicular magnetization film, in comparison with an element composed of an in-plane magnetization film, there is a large difference in stability of the magnetization when the element is finely structured. Specifically, when an element is composed of a known magnetoresistive film such as NiFe/Cu/Co, an amount of saturation magnetization is approximately 800 emu/cc or more, and if the width of the element is in the submicron range, a demagnetizing field increases because magnetic poles on the ends of the film move closer to one another, and thus, the spins rotate at the film ends and are aligned parallel to the ends. On the contrary, in a perpendicular magnetization film, the amount of demagnetizing energy is smaller than a P perpendicular magnetic anisotropy constant, and therefore, the amount of saturation magnetization is suppressed at approximately 300 emu/cc or less at the maximum. Even if the width of the element is decreased, the magnetic poles on the "ends" of the film do not move closer to one another, and the demagnetizing field does not increase. Accordingly, even at a submicron width, magnetization can be maintained sufficiently stably. Therefore, when the element is used for a,memory element, the integration can be significantly enhanced.

Embodiment 2

A magnetic thin film element of this embodiment has the structure shown in FIGS. 4A and 4B, and a nonmagnetic layer 13 interposed between a first magnetic layer 11 and a second magnetic layer 12 is composed of a good conductor. This element is hereinafter referred to as a spin scattering element. A good conductor preferably has higher conductivity than that of the first magnetic layer 11 or the second magnetic layer 12, and, for example, Cu may be used.

Since a good conductor having Cu as a major constituent has its Fermi energy close to that of the magnetic layer and has good adhesion, resistance easily occurs at the interface when the magnetization direction changes, and thus a large magneto-resistance ratio can be obtained. Also, preferably, the nonmagnetic layer has a thickness of 5 Å to 60 Å.

Preferably, by providing a magnetic layer having Co as a major constituent, between the first magnetic layer 11 and the nonmagnetic layer 13, or between the second magnetic layer 12 and the nonmagnetic layer 13, or both between the first magnetic layer 11 and the nonmagnetic layer 13 and between the second magnetic layer 12 and the nonmagnetic layer 13, a magneto-resistance ratio is increased, resulting in a higher S/N ratio. In such a case, the layer having Co as a major constituent preferably has a thickness of 5 Å to 20 Å.

The thickness of the first magnetic layer 11 must be set so that a giant magnetoresistive effect is efficiently produced. Specifically, if the thickness of the first magnetic layer 11 greatly exceeds a mean free path of electrons, the effect decreases because of phonon scattering, and thus the thickness is preferably 200 Å or less, and more preferably 150 Å or less. However, if the first magnetic layer 11 is excessively thin, resistance of the cell decreases, resulting in a decrease in output of playback signals as well as difficulty in retaining the magnetization, Therefore, the thickness of the first magnetic layer 11 is preferably 20 Å or more, and more preferably 80 Å or more.

Since the thickness of the second magnetic layer 12 is set so that a giant magnetoresistive effect is efficiently produced, the same as the first magnetic layer 11, the thickness is preferably 200 Å or less, and more preferably 150 Å or less. However, if the thickness is excessively small, resistance of the cell decreases, resulting in a decrease in output of playback signals as well as difficulty in retaining the magnetization. Therefore, the thickness of the second magnetic layer 12 is preferably 20 Å or more, and more preferably 80 Å or more.

In order to improve a S/N ratio, a unit including a first magnetic layer, a nonmagnetic layer, a second magnetic layer and a nonmagnetic layer may be deposited a plurality of times. As the number of units to be deposited increases, a magneto-resistance ratio increases, which is preferable. However, if the number is excessively large, the thickness of the magnetoresistive film increases and a large volume of electric current is required. Therefore, the number of units to be deposited is preferably 40 or less, and more preferably approximately 3 to 20.

Embodiment 3

A magnetic thin film element of this embodiment has the structure shown in FIGS. 4A and 4B, and a nonmagnetic layer 13 interposed between a first magnetic layer 11 and a second magnetic layer 12 is composed of an insulator, and thus a spin-tunnel film is formed. When an electric current is applied perpendicular to the film surface during reproducing, tunneling of electrons from the first magnetic layer 11 to the second magnetic layer 12 occurs.

Since such a spin-tunnel element has a higher magnetoresistance ratio in comparison with the spin scattering element described above, output signals having a satisfactory S/N ratio can be obtained.

In the spin-tunnel magnetic thin film memory element of this embodiment, a ferromagnetic tunnel junction, which includes a ferromagnetic material, an insulator, and a ferromagnetic material, is formed. Since conduction electrons of the ferromagnetic materials tunnel while maintaining the spins, tunnel probability varies depending on the magnetization condition of both magnetic layers, resulting in a change in tunnel resistance. Accordingly, when the magnetizations of the first magnetic layer 11 and the second magnetic layer 12 are parallel, resistance is small, and when the magnetizations of the first magnetic layer 11 and the second magnetic layer 12 are antiparallel, resistance is large. As the difference in density of states between upward spins and downward spins increases, the resistance increases, resulting in larger output signals. Thus, a magnetic material having high spin polarizability is preferably used for the first magnetic layer 11 and the second magnetic layer 12. Specifically, with respect to the first magnetic layer 11 and the second magnetic layer 12, Fe, which has high polarizability of upward and downward spins at the Fermi surface, is selected as a major constituent, and Co is selected as a second constituent.

The thickness of the magnetic thin film element of this embodiment is preferably from 100 Å to 5,000 Å. The reason for this is that, firstly, when an oxide is used as the insulator, since magnetism at the interface between the magnetic layer and the oxide is weakened under the influence of the oxide, the portion with weakened magnetism dominates in the entire film if the thickness is small, resulting in an adverse effect on the magnetism of the film. Secondly, when a memory element is refined to the submicron range, since the volumes of the first magnetic layer 11 and the second magnetic layer 12 decrease, perpendicular magnetic anisotropic energy decreases, resulting in a decrease in the magnetization retention function of the individual layers. Also, if the thickness is excessively large, resistance of the cell increases excessively. Thus, the thickness is preferably 5,000 Å or less, and more preferably, 1,000 Å or less.

As described above, since the magnetic thin film element of this embodiment uses the magnetoresistive effect by spin-tunneling, the nonmagnetic layer 13 must be an insulating layer so that electrons tunnel while retaining their spins. The nonmagnetic layer 13 may be entirely insulating, or may be partially insulating. An example in which an oxide layer composed of an oxidized nonmagnetic metal film is used as the nonmagnetic layer 13 includes an $Al_2O_3$, layer formed by oxidizing a portion of an Al film in air or in a vacuum by plasma oxidation. Other examples are aluminum nitride (AlNx), silicon oxide (SiOx), silicon nitride (SiNx), and nickel oxide (NiOx). Preferably, aluminum oxide (AlOx) is used. Also, in order to cause spin-tunneling, an appropriate potential barrier is required to the energy of conduction electrons of the first and the second magnetic layers. The materials mentioned above relatively easily produce the barrier, which is advantageous in production.

Preferably, the nonmagnetic layer 13 is a uniform layer having a thickness of approximately several tens of Å, and the thickness of its insulating portion has a thickness from 5 Å to 30 Å. If the thickness is less than 5 Å, there is a possibility of an electrical short circuit between the first magnetic layer 11 and the second magnetic layer 12. If the thickness is more than 30 Å, tunneling of electrons does not easily occur. More preferably, the thickness is 5 Å to 25 Å, and still more preferably, the thickness is 6 Å to 18 Å.

Embodiment 4

One of the applications of a magnetic thin film element in accordance with the present invention is an application to a memory element, which records information of "0" or "1" in response to the magnetization direction, and reads information using a difference in resistance.

Figure 6:
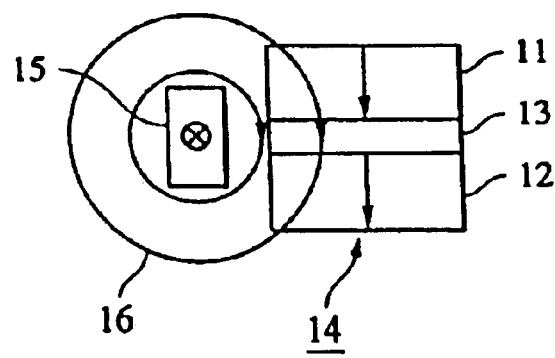
FIG. 6 is a schematic sectional view showing a structure of a memory element in accordance with the present invention, in which the magnetic thin film element shown in FIGS. 4A and 4B is used.

FIG. 6 is a schematic sectional view showing a memory element which uses the magnetic thin film element described above. In FIG. 6, the same members as those in FIGS. 4A and 4B are represented by the same numerals as in FIGS. 4A and 4B, and detailed descriptions will be omitted. Numeral 14 represents the magnetic thin film element shown in FIGS. 4A and 4B, numeral 15 represents a write line composed of a good conductor, and numeral 16 represents a magnetic field generated by applying an electric current to the write line 15.

In the memory element of this embodiment, magnetization information "0" or "1" is recorded in response to the spin direction, i.e., upward or downward, of either the first magnetic layer 11 or the second magnetic layer 12. Whether information is stored in the first magnetic layer 11 or in the second magnetic layer 12 depends on a structure of the element which will be described below. In the memory element of this embodiment, recording is performed by applying an electric current to the write line 15 placed in the vicinity of the first and second magnetic layers 11 and 12, and reversing the magnetization of the first magnetic layer 11 or the second magnetic layer 12 by means of the magnetic field 16 generated. Although, in FIG. 6, an electric current is applied toward (into) the drawing, if the electric current is applied in the reverse direction, a reversed magnetic field is generated and the direction of the spin can be reversed. Whether information is recorded in the first magnetic layer 11 or in the second magnetic layer 12 depends on a medium type as described below. An insulating film (not shown in the drawing) is provided between the write line 15 and the magnetoresistive film 14. The insulating film is provided in order to prevent the write line 15 and the magnetoresistive film 14 from being electrically connected to each other. The deterioration of playback signals caused by the leakage of an electric current applied to the, magnetic thin film element to the write line 15 can thus be prevented.

The magnetoresistive film 14 exhibits low resistance when the spin of the first magnetic layer 11 and the spin of the second magnetic layer 12 are parallel, and exhibits high resistance when they are antiparallel. Therefore, digital information recorded can be detected by detecting the resistance of the magnetoresistive film, or a change in the resistance, as described below.

The write line 15 is set so that a magnetic field is generated perpendicular to the magnetoresistive film 14 by applying an electric current. For that purpose, the write line 15 is preferably placed so that an electric current is applied parallel to the film surface. Also, when the space between the write line 15 and the magnetoresistive film 14 is large, a sufficient magnetic field cannot be applied, and when the space is too narrow, a dielectric breakdown may occur, or a tunnel current may flow. Accordingly, the space is at least from 10 Å to 1 μm, and preferably, from 50 Å to 1,000 Å.

Embodiment 5

A magnetic thin film memory element of this embodiment has the structure shown in FIG. 6, and includes a memory layer (first magnetic layer 11), a nonmagnetic layer 13, and a pinned layer (second magnetic layer 12). In the magnetic thin film memory element, the first magnetic layer 11 is a memory layer for storing magnetic information, and the second magnetic layer 12 is a pinned layer in which the magnetization is always aligned in a predetermined direction in any state (i.e., storing, recording, and reproducing). A method of recording will be described with reference to FIGS. 4A and 4B. Data of "0" and "1" are set to correspond to upward magnetization of the first magnetic layer 11 (FIG. 4A) and downward magnetization (FIG. 4B), respectively. As described above, for recording, the magnetization of the first magnetic layer 11 is reversed by a magnetic field generated by an electric current applied to a write line 15. In such a manner, since resistance is low in a state of "0" and resistance is high in a state of "1", during reproducing, information can be detected from the absolute value of resistance, without reversing the magnetization of the magnetic layer. Therefore, the reversal of the magnetization is not required to detect a change in resistance during reproducing, and reproducing can be performed quickly and with low current consumption.

Although the spin direction of the second magnetic layer 12 is upward in the above description, it may be downward. Also, data of "0" and "1" may be set to correspond to downward magnetization of the first magnetic layer 11 and upward magnetization, respectively.

Although, as magnetic materials for the first magnetic layer 11 and the second magnetic layer 12, the RE-TM materials described above may be used, with respect to the second magnetic layer 12 as the pinned layer, TbFe, TbFeCo, DyFe, DyFeCo, or the like having a high coercive force is preferably used. Additionally, providing an anti ferromagnetic material such as FeMn, IrMn, or NiO on the second magnetic layer 12 on the side opposite to the interface with the nonmagnetic layer will increase the coercive force of the second magnetic layer 12.

If the coercive force of the first magnetic layer 11 is too low, memory characteristics deteriorate, and if it is too high, recording current increases. Accordingly, the coercive force of the first magnetic layer 11 is preferably from 5 Oe to 50 Oe. If the coercive force of the second magnetic layer 12 is too low, there is a possibility of reversal of the magnetization during recording and reproducing, and if it is too high, it is difficult to perform initialization in which the spin is aligned in one direction. Accordingly, the coercive force of the second magnetic layer 12 is preferably from 20 Oe to 20 kOe. Also, the coercive force of the first magnetic layer 11 is preferably set at approximately half of that of the second magnetic layer 12.

Embodiment 6

A magnetic thin film memory element of this embodiment has the structure shown in FIG. 6, and includes a detection layer (first magnetic layer 11), a nonmagnetic layer 13, and a memory layer (second magnetic layer 12). In the magnetic thin film memory element, the second magnetic layer 12 is a memory layer for storing magnetic information, and the first magnetic layer 11 having a small coercive force is provided for reading the magnetic information stored in the second magnetic layer 12 using a magnetoresistive effect. FIGS. 8A through 8D illustrate the magnetization of such a magnetic thin film memory element during recording and reproducing. In FIGS. 8A through 8D, the same members as those in FIGS. 4A and 4B are represented by the same numerals as in FIGS. 4A and 4H, and detailed descriptions will be omitted. The arrows represent the direction of the magnetic spin of the individual magnetic layers.

In this embodiment, data of "0" and "1" are set to correspond to upward magnetization of the second magnetic layer 12 (FIG. 8A) and downward magnetization (FIG. 8B), respectively. For recording, the magnetization of the second magnetic layer 12 is reversed by a magnetic field generated by recording current.

For reproducing, an electric current which is weaker than that during recording is applied to a write line, or, as described below, an electric current is applied to only one of two write lines provided, to generate a magnetic field which is smaller than that during recording, and the magnetization of the detection layer, only, is reversed, without reversing the magnetization of the memory layer. For example, when "0" is recorded, the magnetization is changed from a state shown in FIG. 8A to a state shown in FIG. 8C, or the reverse. When "1" is recorded, the magnetization is changed from a state shown in FIG. 8B to a state shown in FIG. 8D, or in reverse. Resistance changes from low to high in the case of "0", and changes from high to low in the case of "1". Thus, recorded information can be detected by a change in resistance. In this method, even a minute change in signals can be detected using differential detection or the like, in comparison with the method of detecting the absolute value of resistance, and thus, reproducing can be performed with high detectivity.

Additionally, data of "0" and "1" may be set to correspond to downward magnetization of the second magnetic layer 12 and upward magnetization, respectively.

Although, as :magnetic materials for the first magnetic layer 11 and the second magnetic layer 12, the RE-TM materials described above may be used, since the magnetization of both layers is reversed during recording and reproducing, GdFe, GdFeCo, or the like having a lower coercive force is preferably used.

If the coercive force of the first magnetic layer 11 is too low, playback signals deteriorate, and if it is too high, regenerative current increases. Accordingly, the coercive force of the first magnetic layer 11 is preferably from 2 Oe to 20 Oe. If the coercive force of the second magnetic layer 12 is too low, memory characteristics deteriorate, and if it is too high, recording current increases. Accordingly, the coercive force of the second magnetic layer 12 is preferably from 5 Oe to 50 Oe. Also, the coercive force of the first magnetic layer 11 is preferably set at approximately half of that of the second magnetic layer 12.

Embodiment 7

Figure 7:
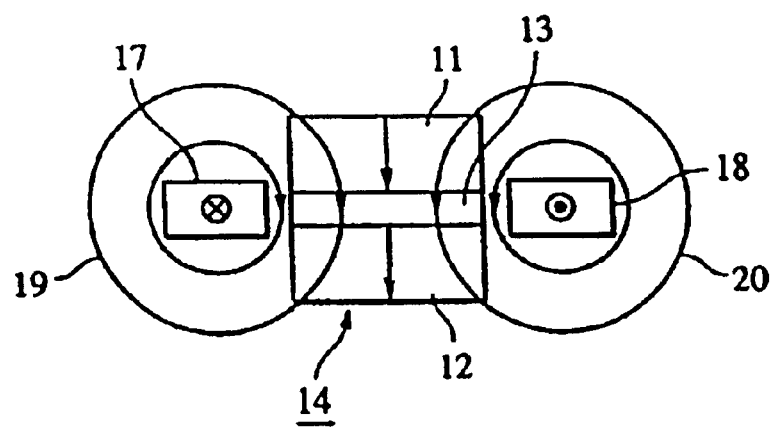
FIG. 7 is a schematic sectional view showing another structure of a memory element in accordance with the present invention, in which the magnetic thin film element shown in FIGS. 4A and 4B is used.
Figure 8A:
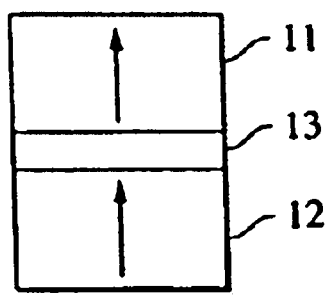
FIGS. 8A through 8D are diagrams which illustrate the magnetization of a memory element in accordance with the present invention.
Figure 8B:
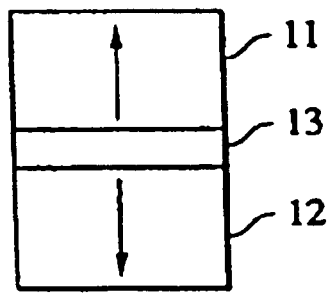
Figure 8C:
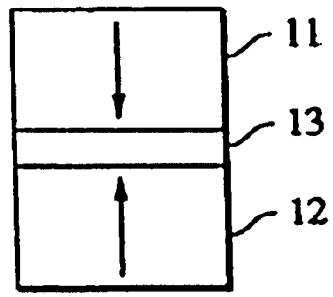
Figure 8D:
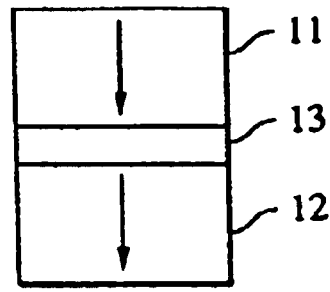

If two or more write lines are placed in the vicinity of a magnetoresistive film 14 as shown in FIG. 7, magnetic fields generated by the individual write lines are added, enabling the generation of a larger magnetic field. In FIG. 7, numeral 14 represents the magnetic thin film element shown in FIGS. 4A and 4B, numerals 17 and 18 are write lines composed of a good conductor, and numerals 19 and 20 are magnetic fields generated by applying an electric current to the write lines 17 and 18, respectively.

In the structure including a detection layer (first magnetic layer 11), a nonmagnetic layer 13, and a memory layer (second magnetic layer 12), a weaker magnetic field is generated during reproducing in comparison with during recording. Therefore, by applying an electric current to one write line during reproducing and by applying an electric current to two write lines during recording, a current margin between reproducing and recording can be increased, resulting in the stable operation with no recording errors during reproducing.

Embodiment 8

When one memory chip has a capacity of several hundreds of megabytes or several gigabytes, a plurality of one-bit memory cells including magnetic thin film elements in accordance with the present invention are arrayed in a matrix to constitute the entire memory. In such a case, since reading is performed independently for each cell, if a write line and a selector transistor are provided on each cell, integration decreases. Thus, a common write line is preferably provided on a plurality of cells.

However, in such a structure, when an electric current is applied to the write line, a magnetic field is applied to a plurality of memory cells at the same time. Therefore, it is required to make a structure in which the magnetization of one memory cell, only, can be reversed, for example, by applying an electric current to the memory cell to be recorded. For that purpose, an active element such as a field effect transistor may be used for applying an electric current independently to a memory cell during reproducing. Thus, an electric current can be applied selectively to one memory cell among many memory cells in the vicinity of the write line. Since the electric current path can be the same as that used for reproducing and is perpendicular to an electric current applied to the write line, the magnetic field generated by the electric current is perpendicular to the magnetic field generated by the write line, and thus, the memory cell selected by the active element has applied to it, a larger resultant magnetic field in comparison with other memory cells, resulting in reversal of magnetization.

Figure 9:
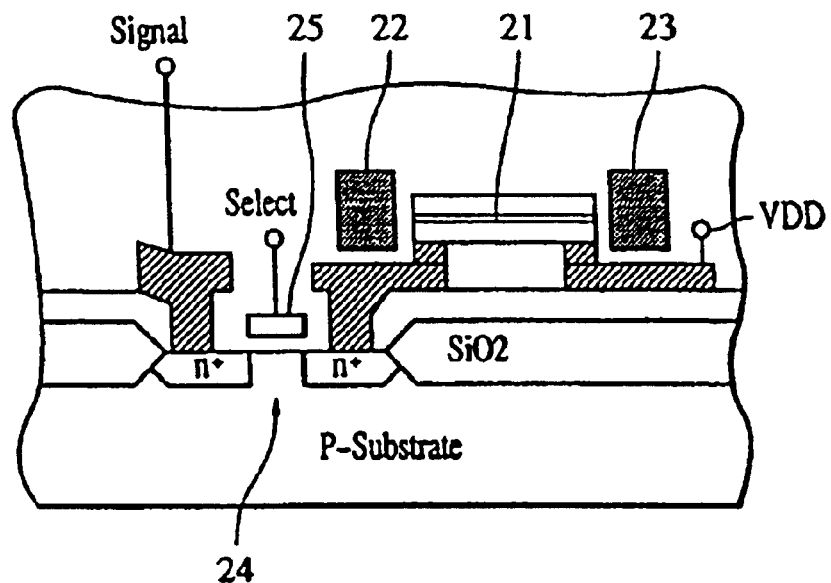
FIG. 9 is a schematic sectional view of a memory cell using a memory element in accordance with the present invention.
Figure 10:
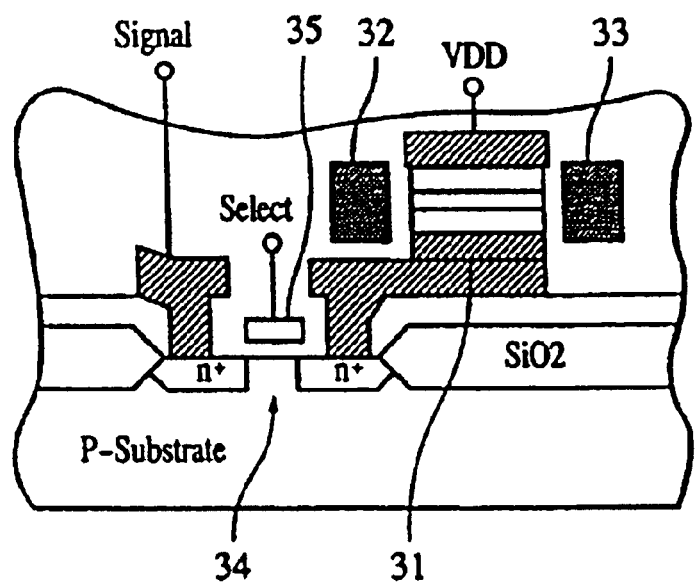
FIG. 10 is a schematic sectional view of another memory cell using a memory element in accordance with the present invention.

FIGS. 9 and 10 illustrate such memory cells in which one end of a magnetic thin film element is connected to a transistor and the other end is connected to a source voltage VDD. In FIG. 9, numeral 21 represents a magnetic thin film element, numerals 22 and 23 represent write lines, numeral 24 represents a transistor, and numeral 25 represents a control gate. In FIG. 10, numeral 31 represents a magnetic thin film element, numerals 32 and 33 represent write lines, numeral 34 represents a transistor, and numeral 35 represents a control gate. Although not shown in FIG. 9 or 10, a read line composed of a good conductor is connected to the end of the magnetoresistive film 21 or 31, and a sense circuit or the like is connected so that a change in resistance can be detected. Write lines 22, 23, 32, and 33 are provided in the vicinity of the magnetoresistive films 21 and 31 with an insulator composed of $SiO_2$, SiNx or the like therebetween. The write lines are placed perpendicular to the drawing and are used for writing to other memory cells (not shown in the drawing). The reproducing electric current path is horizontal in FIG. 9, and vertical in FIG. 10. In the spin-tunnel element, the structure as shown in FIG. 10 is adopted. Although, in the spin scattering element, either structure may be adopted, preferably the structure as shown in FIG. 9, in which the electric current is applied horizontally, is used since the absolute value of resistance decreases in the structure as shown in FIG. 10 in which the electric current is applied perpendicular to the film surface.

Also, with respect to the structure including a detection layer (first magnetic layer), a nonmagnetic layer, and a memory layer (second magnetic layer), during reproducing, the magnetization of the detection layer can be reversed by applying a magnetic field to the magnetic thin film element of a specific memory cell in the same manner as during recording. Thus, a change in resistance occurs and the change is amplified by the sense circuit to be detected. In such a manner, information in a specific memory cell among many memory cells can be read.

Also, with respect to the structure including a memory layer (first magnetic layer), a nonmagnetic layer, and a pinned layer (second magnetic layer), since the absolute value of resistance is detected, the resistance of the element selected by the active element is amplified by the sense circuit for detection.

Additionally, the magnetic thin film element and the magnetic thin film memory element described in the embodiments may be used for a magnetic sensor, or a magnetic head of a hard disk or the like.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A magnetic memory comprising a magnetoresistive film comprising:

a first magnetic layer comprising a perpendicular magnetization film;

a second magnetic layer comprising a perpendicular magnetization film having a higher coercive force than that of said first magnetic layer;

a nonmagnetic layer arranged between said first magnetic layer and said second magnetic layer;

a switch element connected to said first magnetic layer or said second magnetic layer;

a plurality of write lines arranged in parallel to each other in the vicinity of the magnetoresistive film; and a periphery of the write lines surrounded by an insulator.

* * * * *

UNITED STATES PATENT AND TRADEMARK OFFICE
CERTIFICATE OF CORRECTION

PATENT NO. : 6,847,545 B2
DATED : January 25, 2005
INVENTOR(S) : Naoki Nishimura It is certified that error appears in the above-identified patent and that said Letters Patent is hereby corrected as shown below:

<u>Title page,</u>
Item [57], ABSTRACT,
Line 6, "nonmagenetic" should read -- nonmagnetic --.

<u>Column 1,</u>
Line 48, "means" should read -- by means --.

<u>Column 5,</u>
Line 4, "i1" should read -- 11 --.

<u>Column 9,</u>
Line 36, "anti" should read -- anti- --.

<u>Column 10,</u>
Line 33, ":magnetic" should read -- magnetic --.

Signed and Sealed this

Twenty-fourth Day of May, 2005

JON W. DUDAS
*Director of the United States Patent and Trademark Office*